United States Patent [19]
Arnaud et al.

[11] Patent Number: 5,260,891
[45] Date of Patent: Nov. 9, 1993

[54] BLOCH LINE MAGNETIC MEMORY

[75] Inventors: Lucile Arnaud, du Moucherotte; Ben J. Youssef, Paris; Didier Challeton, St. Egrève; Jacques Miltat, Orsay, all of France

[73] Assignee: L'Etat Francais represente par la Delegue General, Armees, France

[21] Appl. No.: 762,897

[22] Filed: Sep. 19, 1991

[30] Foreign Application Priority Data

Sep. 28, 1990 [FR] France .................. 90 12008

[51] Int. Cl.$^5$ .................. G11C 19/08; G11C 11/14
[52] U.S. Cl. .......................... 365/29; 365/87
[58] Field of Search ............. 365/29, 87, 33; 252/62.57

[56] References Cited

U.S. PATENT DOCUMENTS

| | | | |
|---|---|---|---|
| 3,932,688 | 1/1976 | Sugita et al. | 365/33 |
| 4,263,374 | 4/1981 | Glass et al. | 365/33 |
| 4,926,377 | 5/1990 | Hidaka | 365/29 |

OTHER PUBLICATIONS

Fernseh und Kino Technik. vol. 41, No. 1/2, Jan. 1987, Berlin de pg. -3-42; Engemann: "Digitale Speichermedien der Zukunft" p. 37, col. 2, line 1-p. 39, col. 3, line 6; FIGS. 9-13.
Proceedings: "VLSI and Computer Peripherals" Comp Euro 89; pp. 1.68-1.75; Engemann Vertical Bloch Line Memory: State of the Art and Future Prospect.
Japanese Journal of Applied Physics. vol. 25, No. 3, Mar. 1986, Tokyo JP pp. 228-231; Hidaka: "A Bloch Line Pair Generator using the Flank Wall Near the Stripe Domain Head for the Bloch Line Memory", p. 229, col. 1, line 13-p. 229, col. 2, line 5.
Electronic Product Design Oct. 1985, Bromley, GB pp. 69-72; Clegg: "Vertical Bloch Line Memory Theory and Technology" p. 69, col. 1, line 1-p. 71, col. 1, line 25; FIGS. 1-4.

Primary Examiner—Joseph A. Popek
Attorney, Agent, or Firm—Oliff & Berridge

[57] ABSTRACT

A Bloch line magnetic memory has a magnetic film of thickness h located on a substrate and includes Bloch lines of width Λo. The magnetic film satisfies the condition (1) h/Λo<14 with $\Lambda_o = \sqrt{A/2\pi M s^2}$, in which A represents the magnetic exchange constant and 4πMs represents the saturation magnetization of the film.

6 Claims, 8 Drawing Sheets

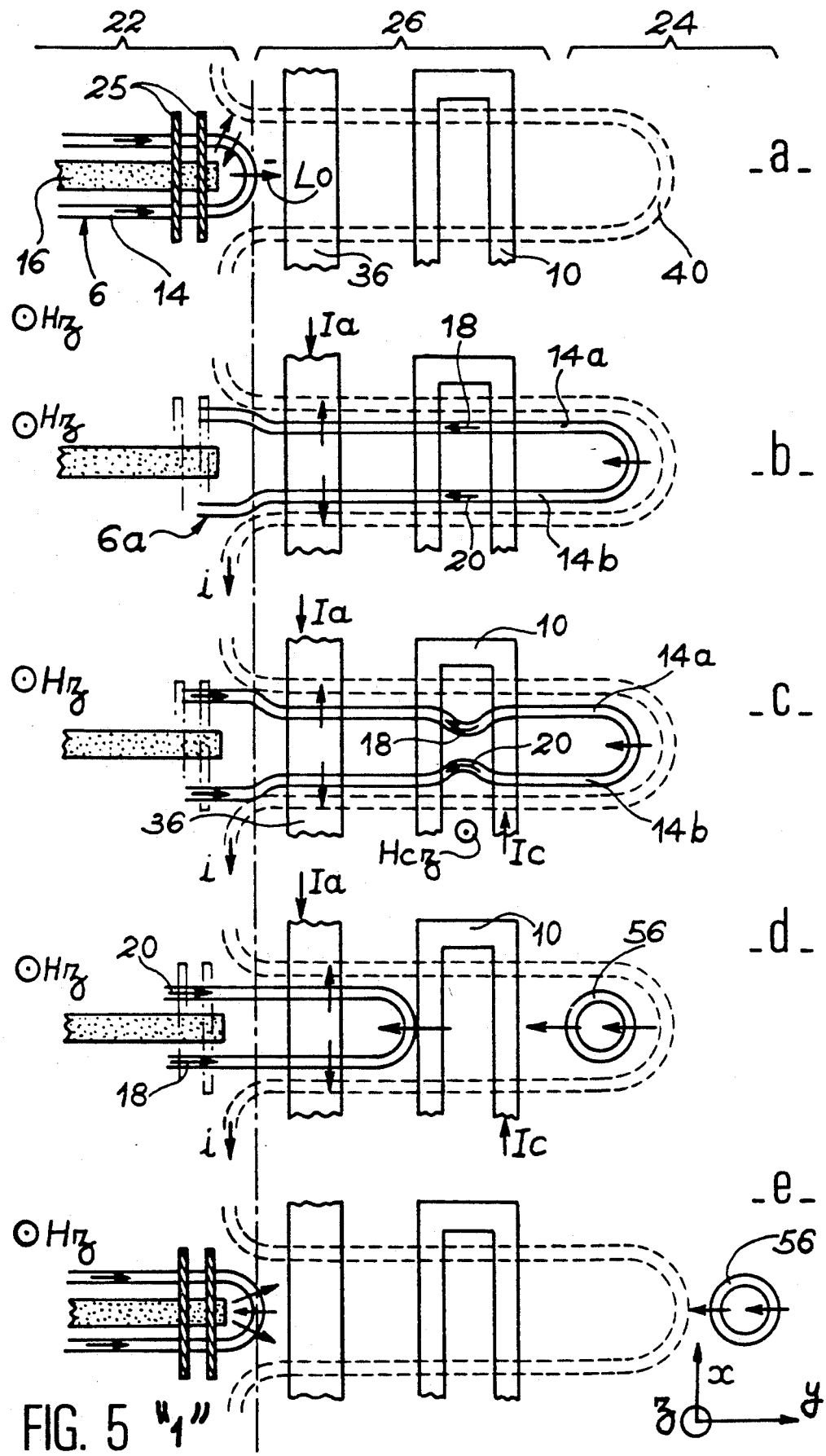

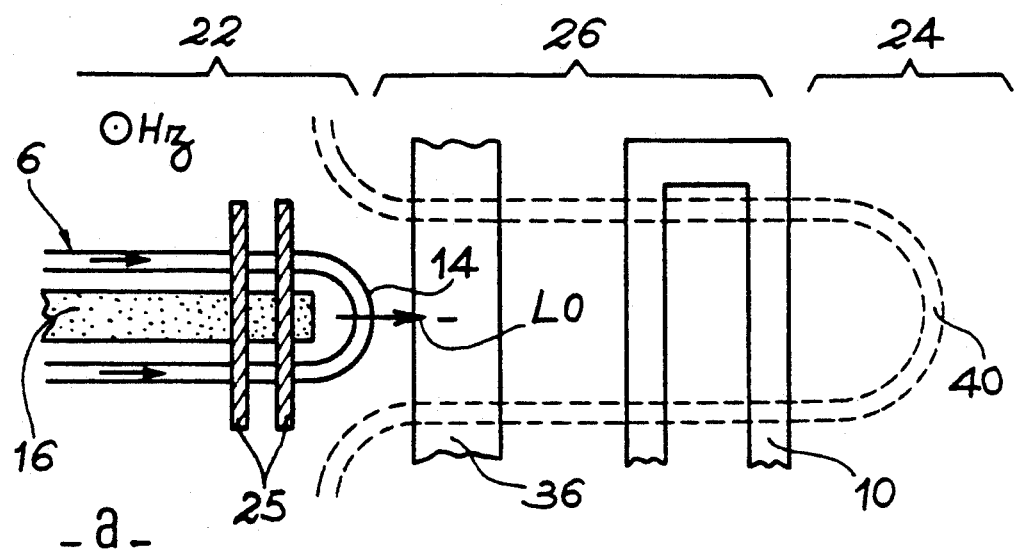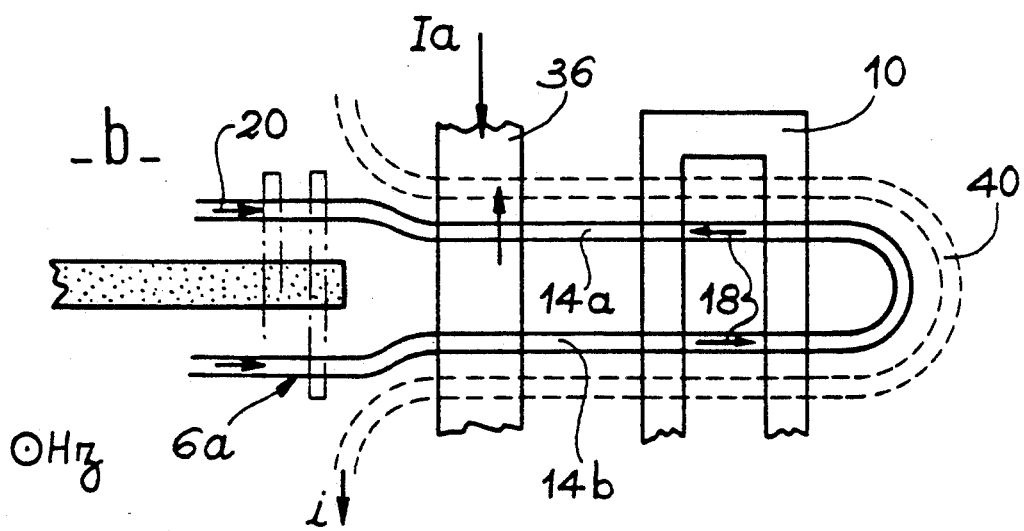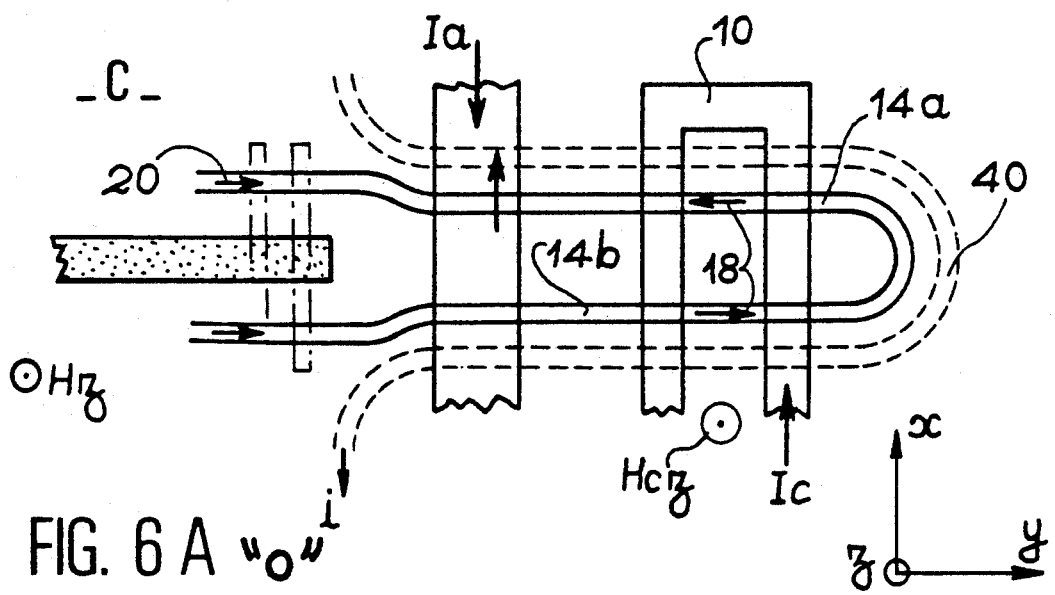
FIG. 6A

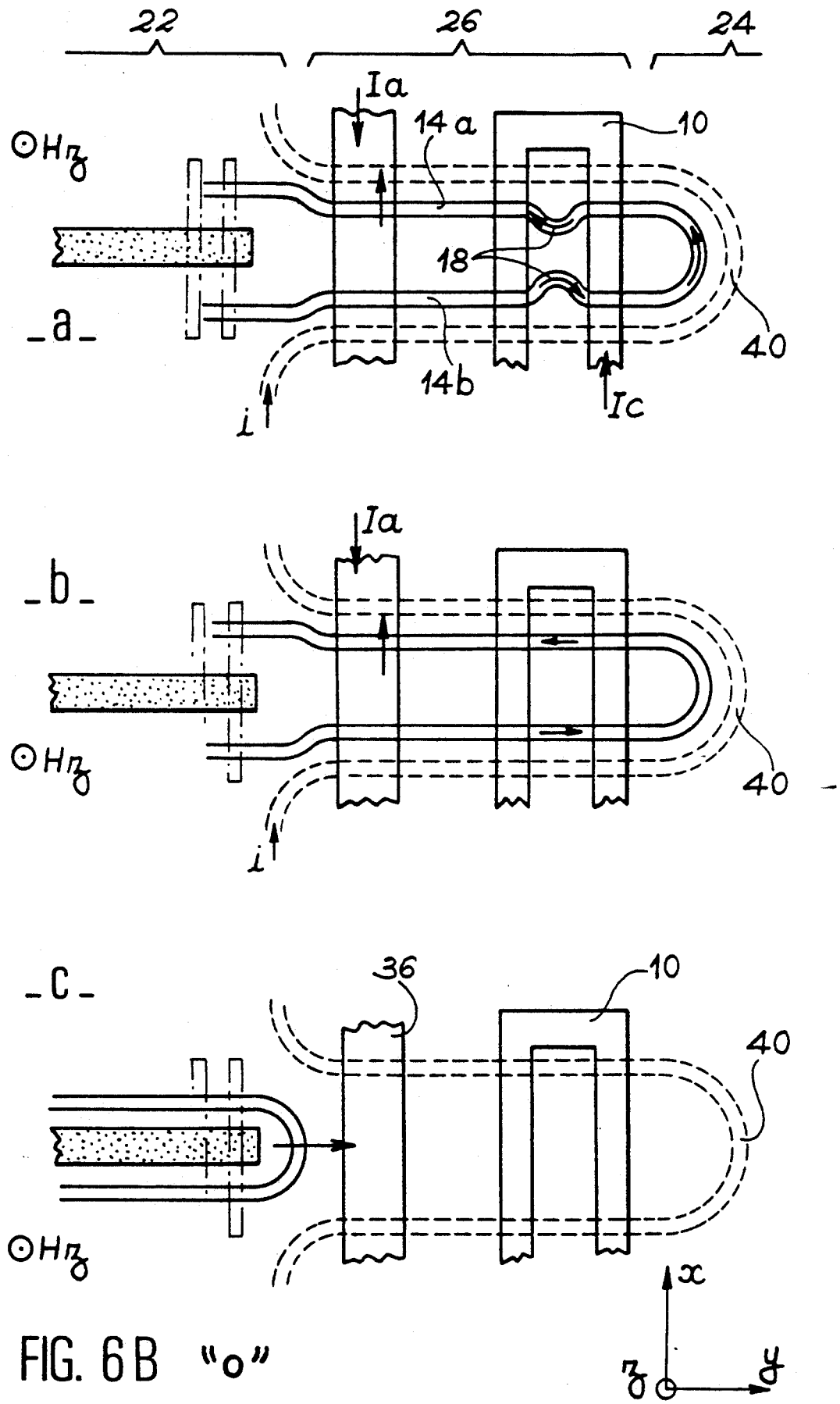
FIG. 6B "o"

BLOCH LINE MAGNETIC MEMORY

BACKGROUND OF THE INVENTION

The invention relates to a Bloch line magnetic memory permitting the storage of binary information.

The principle of the Bloch line memory was proposed in 1983 by S. Konishi in EP-A-0106358 and the article in IEEE Transactions on Magnetics, vol. MAG19, 1983, no. 5, pp. 1838-1840 "A new ultra-high density solid state memory: Bloch line memory".

Bloch line memories use the same material as magnetic bubble memories, but have a much greater storage density than bubble memories.

In known manner and as diagrammatically shown in section in FIG. 1, Bloch line memories have a magnetic film 2 of thickness h, located on an amagnetic substrate 4 generally of gallium and gadolinium garnet (GGG). The principal surface 7 of the magnetic film 2 is parallel to the plane xy and its easy magnetization axis F is oriented in accordance with the axis z perpendicular to said principal surface 7.

This magnetic film 2 contains strip or stripe domains 6 and the Bloch lines 8a, 8b of the memory shown in greater detail in FIG. 2. It supports several electrical conductor levels such as 11 and 13 necessary for the operation of the memory. In particular, the upper level 13 incorporates cutting conductors 10 for the strip domains.

These cutting conductors are used both for the reading and writing of an information. They in particular make it possible to discriminate between an easy cut and a difficult cut of the strip domains as a function of the presence or absence of a pair of Bloch lines respectively corresponding to the information "1" or "0". This cut discrimination is consequently one of the essential operations of a Bloch line magnetic memory.

An electrical insulator 12, called a spacer, is located between the electrical conductors of the lower level and the magnetic field 2. In the same way, an electrical insulator 15 or spacer is located between the different levels of conductors. The distance separating the cutting conductors 10 and the film 2 is designated D.

Each strip domain 6 is surrounded by a wall 14 having a certain thickness and their "stabilization" in the magnetic film is ensured by stabilization zones 16 more particularly formed by ionic implantation or etching of the film 2 over its entire thickness. The stabilization of the strip domains is in particular described in the article by H. Kawahara et al, IEEE Transations on Magnetics, vol. MAG. 23, no. 5, September 1987, pp. 3396-3398, "A new method to stabilize multi-stripe domains for a Bloch line memory".

The arrows 18 and 20 indicate the magnetization of the wall 14 and their orientation is dependent on the information contained in the domain 6. The arrows 18 are oriented clockwise and the arrows 20 counterclockwise. The magnetization in the strip domains is opposite to that of the remainder of the magnetic material.

The Bloch lines appear whenever the magnetization in the wall 14 changes direction and are perpendicular to the surface 7 of the film 2. The Bloch lines are always in pairs, namely a line 8a and a line 8b and must have a negative sign for the operation of the memory. For a pair of Bloch lines 8a, 8b, the magnetization in the wall section 18 between the two lines is opposite to the magnetization of the remainder of the wall 20. The sign of a line 8a, 8b does not correspond to the direction of the arrows shown in the drawings, but instead to the rotation direction of the magnetization on the passage of the line from the wall.

Whatever the magnetization orientation in a domain, a Bloch line is defined +, if the rotation of the magnetization on the passage of the line is added to the rotation of the magnetization in the wall of the domain and a Bloch line is defined − when the rotations of these two magnetization are opposed.

The strip domains 6 have two ends respectively 3 and 5 called the first and second strip heads. They are extendible and retractable in a direction passing through said two ends 3 and 4 when a continuous, appropriate control field $\vec{Hz}$ is applied thereto, in the direction z and oriented from the upper surface 7 of the film to its lower surface 9. Generally, even when the domains contain no information "1", a negative Bloch line at each end of the strip domain is entered and positioned prior to the opposition of the memory.

The organization of a Bloch line memory is similar to that of a bubble memory. This organization is diagrammatically shown in FIG. 3. It comprises a storage zone 22, an access zone 24 and transfer gates or ports 26 between the storage zone and the access zone.

The storage zone is constituted by parallel strip domains 6, whose walls 14 function as minor loops. The stabilization of the lines and the domains is ensured by raster patterns 25 perpendicular to the domains and raster patterns 16, 27 parallel to the domains.

The access zone 24 generally has two insulated conductors 28, 30 arranged in herringbone manner, a generator 32 and a detector 34 of magnetic bubbles 31 in the vicinity of said conductors.

The informations "1" and "0" respectively correspond to the presence or absence of a pair of Bloch lines 8a, 8b in the storage zone. Generally, the presence and absence of a bubble 31 in the access zone 24 correspond respectively to the informations "1" and "0" for reading and the reverse for writing.

The input, the electrical writing signals are converted into magnetic information by the generator 32. The information is stored in the access zone up to the filling thereof. A parallel transfer via the transfer gates 26 passes the information from the access zone to the strip domains. On writing, the new information must replace the old information, so that the writing is accompanied by erasure.

For reading, the information contained in the strip domains 6 is transferred into the access zone for detection. The information contained in the storage zone must not be destroyed. In order to obtain access to a given information, it is necessary that the corresponding bits face the transfer gates 26. The latter must perform two functions, namely the information exchanged during writing and "duplication" during reading.

In known manner, the transfer gates 26 incorporate a checking conductor 36, a strip domain cutting device 10, a writing conductor 38 for the Bloch line pairs which is separate from the device 10 and strip domain extension conductors 40. The cutting device can consist of a conductive hairpin traversed by a current or two parallel conductive strips, which are traversed by currents of the same intensity, but the opposite sense. The reference 10a and 10b represent the two conductive strips (or the two arms of the hairpin) of the cutting device.

The writing conductor 38 can be in the form of a strip, in the manner shown, or can be shaped like a hairpin. Moreover, said conductor 38 can coincide with the cutting device 10. In the latter case, the cutting device 10 is used for both reading and writing.

All the electrical conductors are electrically insulated from one another and their respective shapes and arrangement are variable. In general, the extension conductors constitute the first levels 11 of conductors and the conductors 36, 38 and 10 the other levels 13. The conductors 38, 10, 36 and 40 are respectively connected to electric power supplies 42, 44, 46 and 48.

The writing of a pair of Bloch lines (−, −) corresponding to the information "1" (or transfer in) requires different phases shown in FIGS. 4A to 4B.

In part a of FIG. 4A, the strip domain 6 is at rest and its wall 14 surrounds the stabilization zone 16. An external permanent magnet e.g. creates the polarization field $\vec{Hz}$. Patterns 25, oriented perpendicular to the domain 6, make it possible to fix the position of the lines. The Bloch line of the end 3 of the strip domain is designated Lo and is always of sign −.

The first writing phase shown in part b of FIG. 4A consists of extending the strip domain beneath the electrical conductors 36, 38 and 10 by applying an appropriate current i to the extension conductor 40. This current i will be applied throughout the writing period.

Simultaneously with the extension, the checking conductor 36 is activated by a current Ia. The planar magnetic field Hya created below the latter blocks the end line Lo. This current Ia will be applied throughout the writing period. The extended strip domain carries the reference 6a.

This is followed by the actual writing of the pair of Bloch lines (−,−). To do this, writing firstly takes place of an unstable pair of lines (+, −) (part c of FIG. 4A), which is then converted into a stable pair (−,−) (parts a and b of FIG. 4B).

On supplying in known manner a current pulse Ie of approximately 70 mA for 40 ns with a rise and fall time of 10 ns into the writing conductor 38, the locally created magnetic field is adequate for horizontal Bloch loops to be created. If the current Ie is maintained (for 10 to 100 ns, as a function of the magnetic films 2 involved), the loops produced "percent" and the pairs of Bloch lines 50 of opposite polarities (+,−) are nucleated in the wall 14 of the extended domain 6a (part c of FIG. 4A).

Thus, locally the current Ie displaces the wall 14 of the domain. If the local displacement speed of the wall 14 is equal to or greater than the nucleation speed $v^0n$ (said speed only being dependent on the parameters of the magnetic film 2), there is a nucleation of the Bloch loops in the lateral parts 14a or 14b of the wall traversed by the writing conductor 38, on the surface of the film 2 or at the film-conductor interface 2-11. The nucleation of a single pair corresponding to the pair (+,−) 50 is possible if an external planar field $\vec{Hey}$ is applied. Only the wall whose magnetization is opposite to the direction of the field $\vec{Hey}$ will have an adequate speed to permit the nucleation of a Bloch loop. In the presence of the planar field $\vec{Hey}$, immediately after writing, the lines 50 are separated and the line + is moved towards the end 3 (FIG. 4B).

In order to convert the pair (+,−) of lines 50 into a stable pair (−,−) 52, a cutting then takes place of the strip domain 6a (part a of FIG. 4B) by applying a current pulse Ic to the in this case hairpin-shaped conductor 10, creating a vertical, local magnetic field $\vec{Hcz}$ bringing about a local displacement towards one another of the walls 14a and 14b.

By topological continuity of the magnetization vector, a negative line L1 is produced at the end 3 of the domain 6a which has just been cut (part b of FIG. 4B). The magnetic bubble 54 resulting from the cutting of the domain 6a must be evacuated from the access zone and destroyed, because it does not carry any information (part c of FIG. 4B).

Other diagrams can also be considered for writing. For example, a principle proposed by Hitachi in EP-A-0 255 044 is based on the direct writing hypothesis of pairs of negative Bloch lines by the production of a Bloch point.

The invention uses the principle described in FIGS. 4A and 4B.

The return to the rest state of the strip domain 6 (part c of FIG. 4B) is obtained by eliminating the current applied to the extension conductor. In parallel, the current applied to the checking conductor 36 is eliminated.

As has been shown hereinbefore, the nucleation speed $V^0n$ of the Bloch lines is dependent on the parameters of the magnetic film 2. It can be expressed in the following way:

$$v^0n = 24a \cdot A/h \sqrt{Ku}$$

with a being the gyromagnetic factor of the film, A the magnetic exchange constant, h the magnetic film thickness and Ku the uniaxial anisotropy constant.

This nucleation speed is modified in the presence of a planar magnetic field $\vec{Hy}$ in the following way:

$$vn = v^0n + \epsilon \cdot \pi/2 \cdot a \cdot \sqrt{A/Ku} \cdot \vec{Hy}$$

with $\epsilon = +1$ if the magnetization of the film 2 and the field $\vec{Hy}$ are in the same sense and $\epsilon = -1$ if the magnetization and field $\vec{Hy}$ are of opposite senses.

The principle of reading the informations "1" and "0" stored in the strip domains is shown respectively in FIGS. 5 and 6A-6B. The reading of an information, also known as transfer out, involves several stages.

In part a of FIGS. 5 and 6A, the strip domain 6 is at rest. The reading of an information only requires three types of electrical conductors instead of four in certain cases for writing. These consist of an extension conductor 40, a cutting conductor 10 and a checking conductor 36.

As for the transfer in operation, reading firstly requires the extension of the strip domain 6 of the storage zone 22 towards the transfer zone 26 (part b of FIGS. 5 and 6A) and then the actual reading of the pairs of Bloch lines (parts c of FIGS. 5 and 6A and a and b of FIG. 6B).

The reading of a bit takes place by discrimination between an easy cut (FIG. 5) and a difficult cut (FIGS. 6A–6B) of the strip domain 6a. This reading is a duplication, because following the reading operation, the state of the domain 6 is the same as the initial state. Throughout the reading operation, an appropriate current i is maintained in the extension conductor 40.

At the time of the extension of the strip domain 6a, a current Ia is applied to the checking conductor 36 and is maintained throughout the reading operation, in order to block the Bloch lines of the domain 6a and obtain the two reference wall structures:

wall with parallel magnetization for the easy cut in the presence of a pair of Bloch lines (FIG. 5);

wall with antiparallel magnetization for the difficult cut in the absence of a pair of Bloch lines (FIGS. 6A, 6B).

This is followed by the application of a current pulse Ic (parts c of FIGS. 5 and 6A) to the cutting conductor 10. The presence of Bloch lines permits a low current cutting of the strip domain leading to the formation of a bubble 56, which can be read by the bubble detector 34, whereas the absence of Bloch lines only permits the cutting of the strip domain with higher currents than that necessary for the easy cut.

The application of the current Ic to the cutting conductor 10 creates a local magnetic filed $\vec{Hcz}$. When the hairpin-like conductor is positioned perpendicular to the domain 6a to be tested and if the local field $\vec{Hcz}$ is added to the polarization field $\vec{Hz}$ of the domain 6a, it is possible to cut the latter. If the magnetizations 18 and 20 of the walls 14a and 14b point in the same direction below the cutting hairpin, it is easy to cut the domain by the latter (FIG. 5). If the magnetizations of the walls 14a and 14b point in opposite directions beneath the cutting hairpin, it is difficult to cut the domain by the latter (FIG. 6A).

The return to the rest state of the strip domain is still obtained by eliminating the current supplied to the extension and checking conductors (parts e and c of FIGS. 5 and 6B).

The cutting margin is defined as the difference between the high current necessary for the difficult cut and lower current necessary for the easy cut.

It is considered that there is no cutting margin if there is an overlap of the current distributions of the two cut types for all the strip domains of the memory. Conversely a cutting margin is obtained when the current distributions of the two cut types for all the domains are separate.

In addition, for a Bloch line memory to function, it is necessary for it to satisfy the "reading" function, i.e. discriminates the easy cuts from the difficult cuts of the domains and consequently has a cutting margin, which is also known as the reading margin.

SUMMARY OF THE INVENTION

The present invention relates to a Bloch line memory making it possible to obtain a cutting margin during the reading of the lines (transfer out or duplication) and the conversion of the pair $(+,-)$ into the pair $(-,-)$ in the writing of the line pairs (transfer in). The Applicant has found that the magnetic film must satisfy a particular condition in order to obtain this cutting margin.

The invention also relates to a Bloch line memory having a magnetic film of thickness h, located on a substrate and containing Bloch lines of widths $\Lambda o$, characterized in that the magnetic film satisfies the condition (1) $h/\Lambda o < 14$ with $\Lambda o = \sqrt{A/2\pi Ms^2}$, in which A represents the magnetic exchange constant and $4\pi Ms$ represents the saturation magnetization of the film. In general, the magnetic film is epitaxied on a monocrystalline substrate.

The magnetic film used is one of those generally used in bubble memories. It is e.g. possible to use ferrimagnetic garnet films such as those described in FR-A-2 587 734 or those in accordance with the following formula (2):

$$(TR_3)(FeX)_5O_{12} \tag{2}$$

in which TR represents at least one element chosen from among Y, Sm, Lu, Bi, Ca, Gd, Pr and Yb and X represents at least one element chosen from among Al, Ga, Si and Ge.

In such a way that the cutting margin is relatively high, the memory according to the invention advantageously has a device for cutting strip domains able to satisfy certain conditions. This cutting device is either of the hairpin type, or is constituted by two parallel conductive strips. It can be used in the different configurations described hereinbefore, i.e. associated with a checking conductor and a writing conductor, or with a checking conductor only. It can also be used in a structure with two or three levels of conductors.

This cutting device used for writing or reading an information in the memory has two electricity conducting strips, which are parallel and have a width of at the most W and supported by the magnetic film containing the strip domains and oriented perpendicular thereto, said conductive strips being spaced from one another by a distance G and separated from the magnetic film by a distance D, as well as supply means for applying a first current pulse simultaneously to the two conductive strips, the parameters l, W, G and D satisfying the following relations: $1 \leq l/D \leq 6$; $l/W \geq 1.3$ and $l/W \geq 1.3$, with l representing the width of the strip domains.

This cutting device makes it possible to write the information "1" in the memory, by writing (or nucleation) of a pair of Bloch lines and writing the information "0" by erasing a pair of Bloch lines. It also permits the reading of informations stored in the strip domains without any risk of destroying them.

In order to prevent any inappropriate Bloch line production during the cutting of the strip domain, the supply means of the two conductive strips supply a first current pulse having a rise time Tm greater than the rise time To which would be possessed by a second minimum current pulse necessary for the nucleation of the Bloch lines.

This minimum rise time To necessary for the nucleation of the Bloch line has been determined by the inventors and satisfies the following equation (3):

$$To = (\vec{Hcz}/vn) \cdot (h/8Ms/Ln(1+h^2/l^2)) \tag{3}$$

in which $\vec{Hcz}$ is the value of the magnetic field created in the film by the first pulse in a direction perpendicular to the surface of the film, h is the magnetic film thickness, Ln is the natural logarithm, Ms is the saturation magnetization of the magnetic film and vn the nucleation speed of the Bloch lines with $vn = (24a \cdot A/h \cdot \sqrt{Ku}) + \epsilon \cdot \pi/2 \cdot a\sqrt{A/Ku} \cdot \vec{Hy}$ in which a is the gyromagnetic factor of the magnetic film, A is the magnetic exchange constant, Ku is the uniaxial anisotropy constant of the magnetic film, $\vec{Hy}$ is the field created in the plane of the film at least in part by the first pulse and $\epsilon$ is equal to $+1$ or $-1$, when the magnetic magnetization of the wall of the domain and the field $\vec{Hy}$ are respectively of the same and opposite senses.

For any pulse with a rise time Tm > To, the wall of the domain is propagated at a speed below vn. Thus, no Bloch lines are nucleated during the cutting operation. For any pulse with a rise time Tm < To, the wall of the domain is propagated at a speed equal to vn and there is a nucleation of Bloch lines and in particular Tm is approximately 2To.

The above equation (3) of To is only true for magnetic films for which To is >>Ts with Ts=h/8Ms·u, in which u is equal to a/b·$\sqrt{A/Ku}$ (b=attenuation coefficient and equals 0.1 for the compositions used). In general, Ts is approximately 10 ns, whereas To is a few dozen nanoseconds.

According to the invention, $\vec{Hy}$ represents the planar field $\vec{Hcy}$ alone corresponding to the component in the plane xy of the field induced in the magnetic film by the current Ic traversing the cutting conductor, or to which has been added a supplementary external field $\vec{Hey}$ applied along the strip domain, during cutting, if this proves necessary.

BRIEF DESCRIPTION OF THE DRAWINGS

The invention is described in greater detail hereinafter relative to non-limitative embodiments and the attached drawings, wherein show.

FIGS., 4A and 4B already described, the different phases of writing a pair of Bloch lines in a Bloch line memory.

FIGS. 5, and 6A, 6B, already described, respectively the different reading phases of an information "1" and "0" in a Bloch line memory.

Figure 7A:
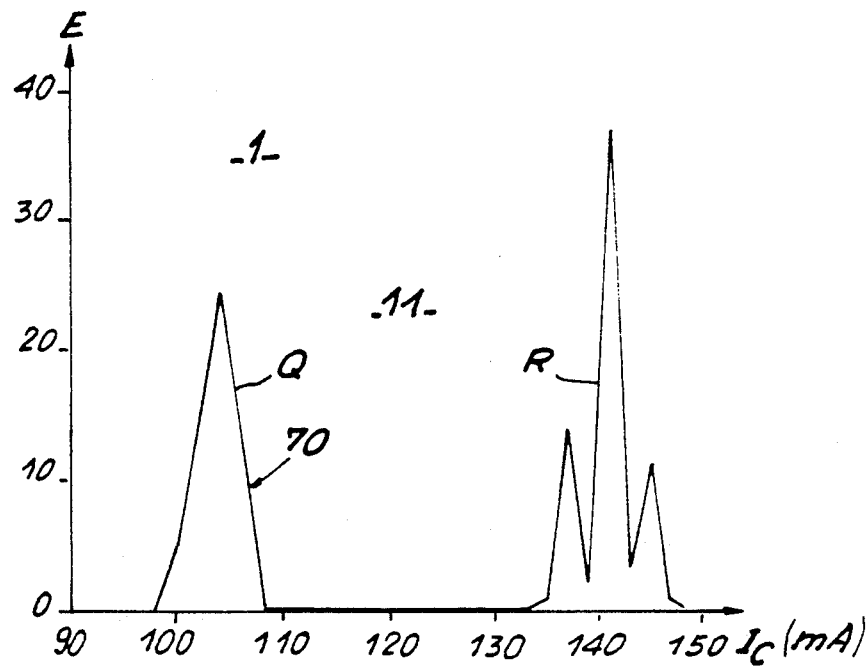
Figure 7B:
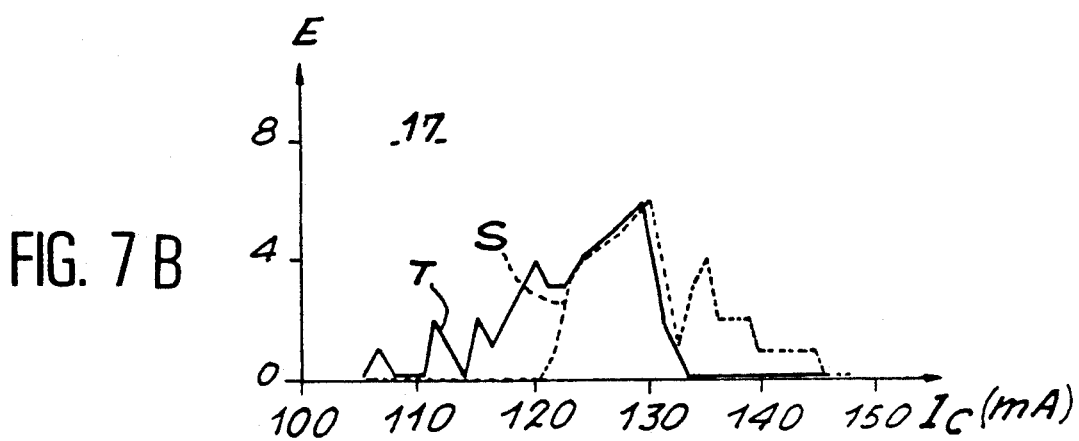

FIGS. 7A and 7B the current distribution of the two types of cut for all the strip domains respectively for a sample satisfying the condition "1" and a sample not satisfying said condition.

DETAILED DESCRIPTION OF PREFERRED EMBODIMENTS

Figure 1:
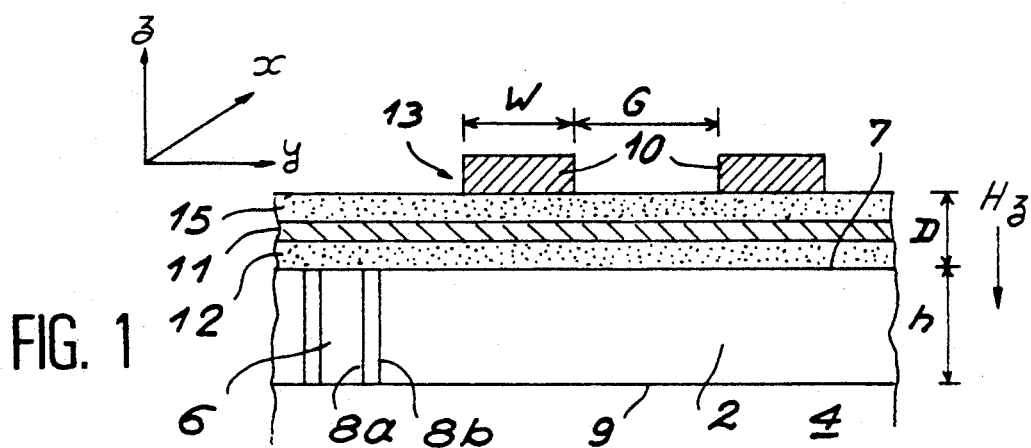
FIG. 1 already described, in section part of a Bloch line memory showing the arrangement of the cutting conductors on the magnetic film.
Figure 2:
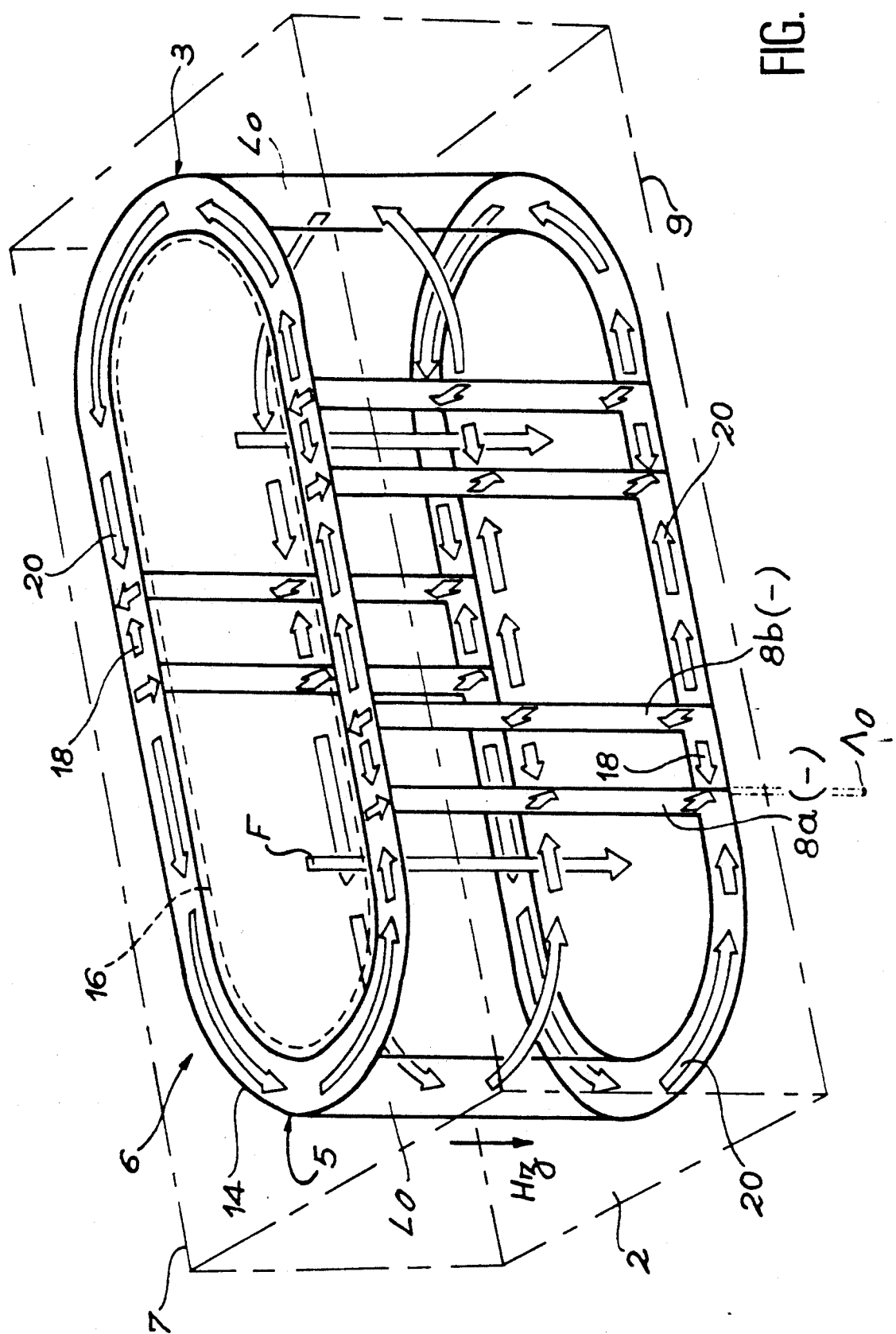
FIG. 2 already described, in perspective, a strip domain of the memory of FIG. 1.

According to the invention, the magnetic film of a Bloch line memory must fulfil the condition (1) h/Λo<14 with Λo=$\sqrt{A/2\pi Ms^2}$, so that the memory can satisfy the "reading" function. h represents the magnetic film thickness (FIG. 1) and Λo the Bloch line width (FIG. 2).

Several samples have been investigated. They were constituted by a ferrimagnetic garnet film epitaxied on to a gallium and gadolinium garnet monocrystal. These films had different compositions, as well as different values A, h and 4πMs. The experimental results are given in the attached table I and comply with condition (1).

Figure 3:
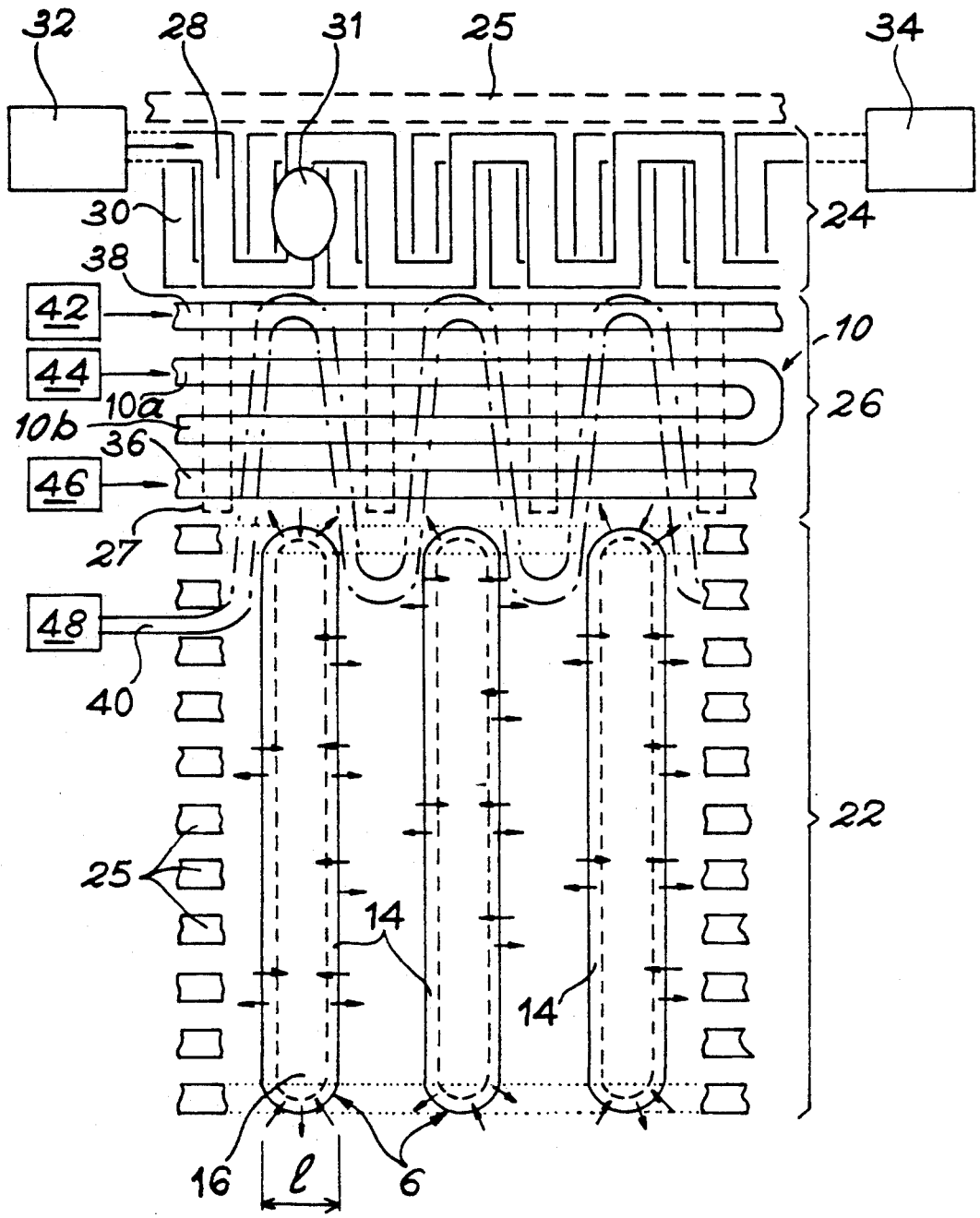
FIG. 3 already described, a plan view of the organization of a Bloch line memory.
Figure 4A:
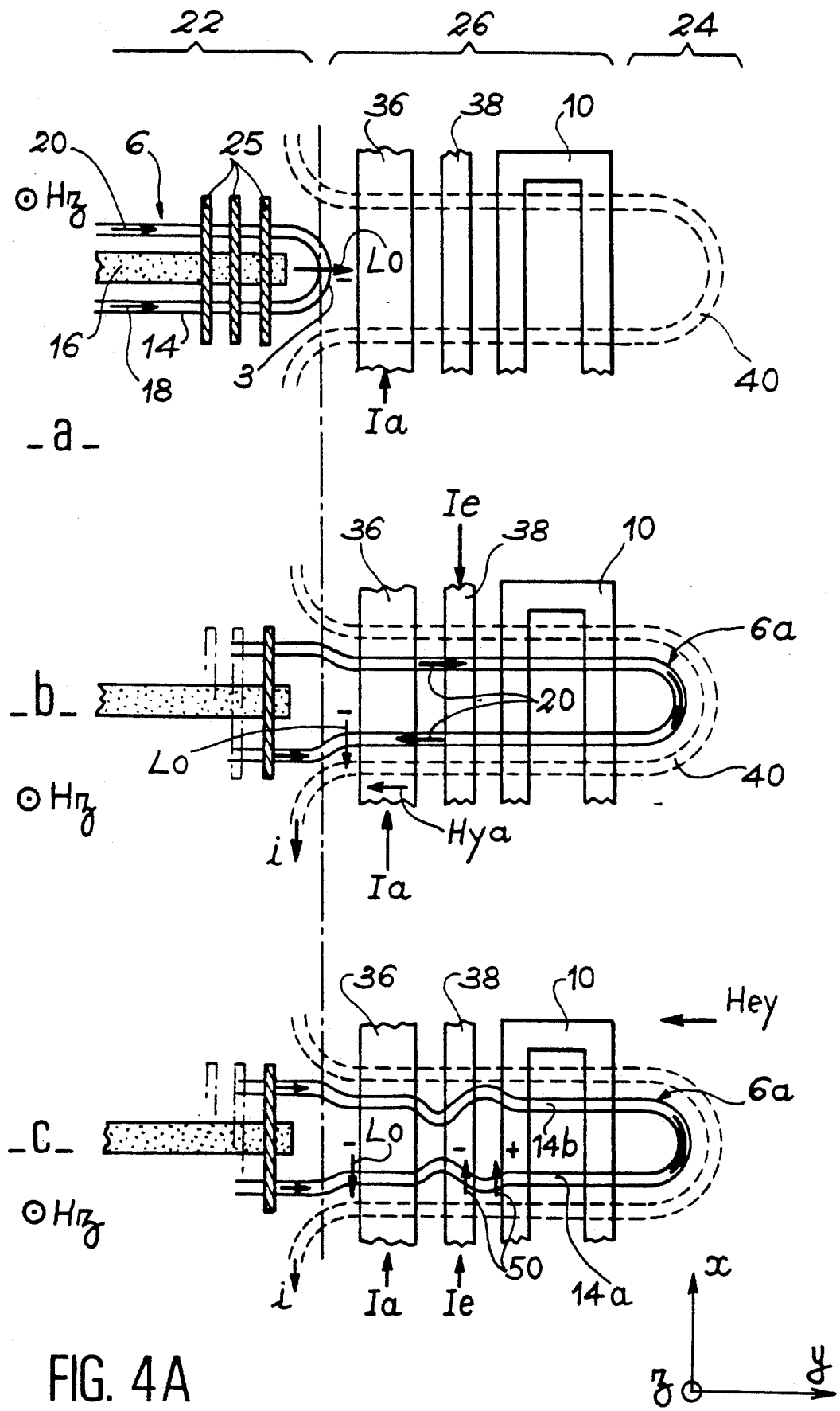
Figure 4B:
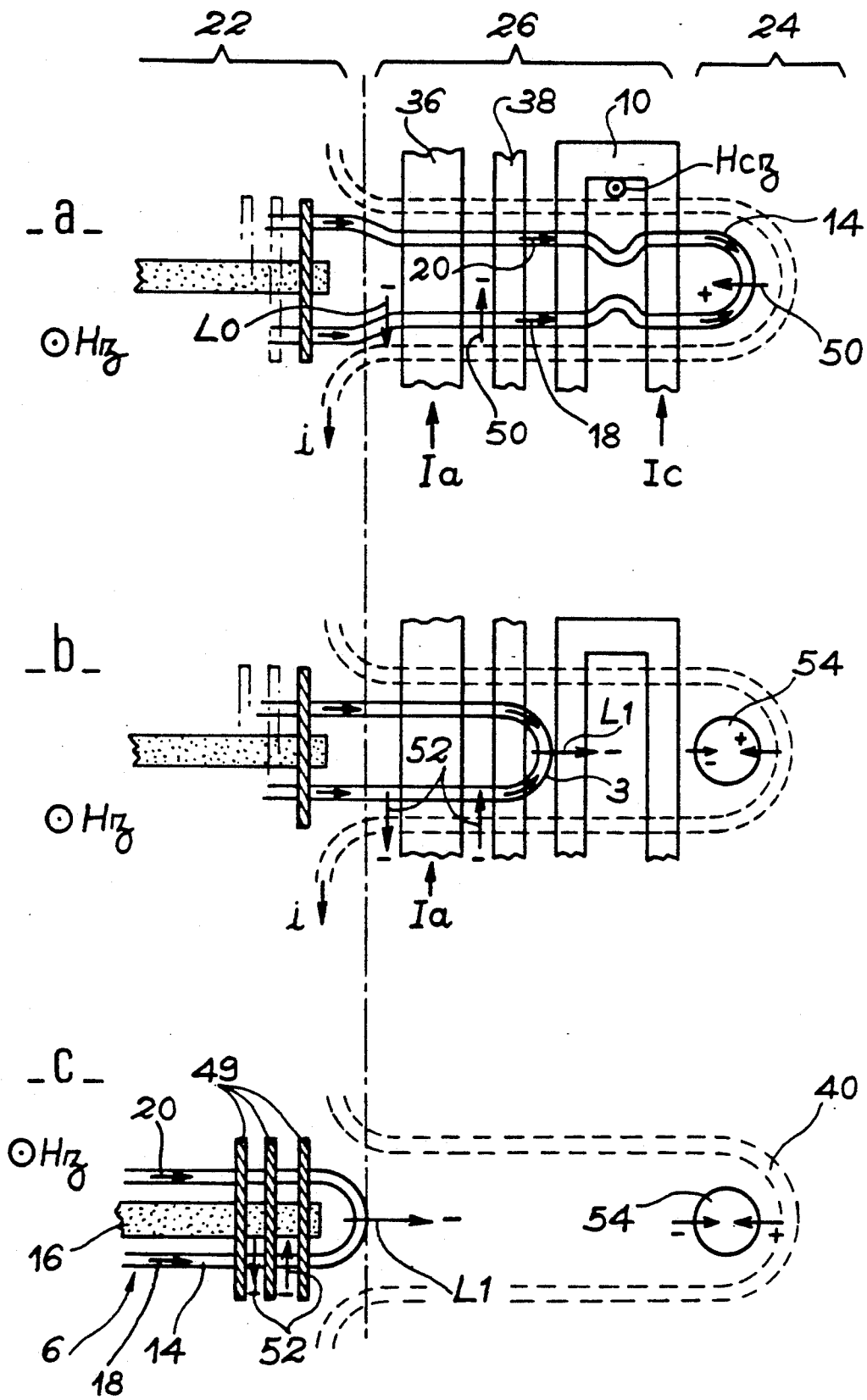

In order to test these samples, use was made of a hairpin-shaped, strip domain cutting conductor positioned perpendicular to the strip domains. The width W of the branches of the hairpin was 2 μm, the distance G (or gap) separating these two branches was 2 μm, the distance D separating the cutting conductor from the ferrimagnetic film was 3 μm and the width l of the strip domains was 5.4 μm. W, G and D are shown in FIG. 1, and l in FIG. 3.

The test consisted of preparing either easy cut domains (FIG. 5) or difficult cut domains (FIGS. 6A-6B). For each of these perfectly identified domains, the cutting current Ic is measured. The measurement of Ic takes place by the stepwise incrementation of the current applied to the hairpin and noting the value of I, which cuts the domain Ic. In all these experiments, the cutting pulse is triangular with a rise time Tm equal to the fall time of 350ns. Therefore it is possible to plot cutting histograms.

It is considered that a sample has a reading margin if the easy cut current distribution of all the strip domains is separated from the distribution of the difficult cut currents of all the strip domains (FIG. 7A). There is no reading margin if the two distributions overlap (FIG. 7B). If the cutting margin is adequate (> up to 1mA), the sample is a good candidate for Block line memories.

FIG. 7A gives the current distribution of two cut types for all the strip domains of the sample 1 and FIG. 7B gives that of the sample 17. E is the number of events and Ic (in mA) the current intensity applied to the cutting conductor. The distributions Q and T are relative to "easy" cuts and the distributions R and S to "difficult" cuts.

The current distributions Q and R of the sample 1 are separated and the cutting margin is approximately 25mA. It is more than adequate and said sample 1 is a good candidate for producing a Bloch line memory. Conversely, the current distributions T and S of the sample 17 overlap and there is no cutting margin. Thus, this sample cannot be used for a Bloch line memory.

The measuring methods used for drawing up table I are given hereinafter.

a) Measurement of the thickness of the film h

This measurement was carried out using a spectrophotometer with variable wavelengths. The magnetic garnet film is considered as a plate with parallel faces. It introduces a path difference e between the light beam reflected on the film—air surface and the light beam reflected on the film—substrate surface.

The maximum light intensity is obtained when e=2nh=kλ, in which n is the index of the film at the wavelength λ and k is an integer. The incidence of the beam is substantially normal to the film.

The passage of the wavelength between the two values λ1=0.68 μm and λ2=0.51 μm reveals a number of light intensity maxima N, such that:

$$N = k2 - k1 = (e2/\lambda 2 = e1/\lambda 1).$$

giving the expression of the expression of the thickness:

$$h = N/2[n_{0.51}/0.51 - n_{0.68}/0.68].$$

The value of the subscripts is dependent on the type of composition. On the basis of values measured by guided optics at λ=0.63 μm, $n_{0.63}$ and λ=1.15 μm, $n_{1.15}$, the values $n_{0.51}$ and $n_{0.68}$ have been calculated (cf. thesis submitted to the INP in Grenoble by Mr. Hubert Moriceau, entitled (in French) "Production of Magnetic Garnet films by Liquid Phase Epitaxy and Characterization of the Films for a Large Capacity Bubble Memory" of Oct. 31, 1981. Reference is e.g. made to the attached table II.

The accuracy of this measurement is approximately 5% for thicknesses h of approximately 1 μm. For smaller thicknesses, 0.4 μm<h<0.7 μm, it is possible to carry out guided optics measurements and for very thin films h<0.4 μm, ellipsometric measurements can be used.

b) Calculation of the magnetization 4πMs

The magnetization is calculated on the basis of the collapse field measurement of the bubbles $\overline{Hco}$ and the value of the characteristic length Ic of the bubbles with the formula:

$$4\pi Ms = \overrightarrow{Hco}\left(lc + \frac{3}{4}\frac{lc}{h} - \sqrt{\frac{3lc}{h}}\right)^{-1}$$

the thus calculated magnetization is accurate to approximately 10%.

c) Calculation of the characteristic length Ic

The following Fowlis and Shaw formulation is used:

$$\frac{lc}{h} = \frac{(2l/h)^2}{\pi^3}\sum_n \frac{1}{n^3}\left[1 - \exp\frac{-n\pi h}{l}\left(1 + \frac{n\pi h}{l}\right)\right]$$

d) Measurement of the width l of the domains

The garnet films have a magnetization perpendicular to the plane of the film and, in the absence of an external magnetic field, have a linear domain structure. Two adjacent domains then have antiparallel magnetizations.

A linearly polarized light traversing the film perpendicular to its surface undergoes a deflection of its polarization axis by $+\theta$ or $-\theta$ as a function of the magnetization direction in the magnetic domain. An analyzer positioned beyond the sample in the light path makes it possible to extinguish the light which has passed through one of the two types of domains. Thus, a Faraday contrast is defined.

By then applying a pulsed field perpendicular to the film and having an adequate amplitude (generally a few hundred A/m), an alignment of the parallel strip domains is brought about. The field is then gradually reduced and then eliminated and the domains remain in the form of parallel strips. A measurement of the width 1 of about 20 strips makes it possible to deduce the value l of the width of a domain. The accuracy of the measurement is approximately 5% for domains of 1.2 μm.

e) Measurement of the collapse field of bubbles $\overrightarrow{Hco}$.

This is the value of the magnetic bubble disappearance field. In order to make the bubbles disappear, it is necessary to apply, perpendicular to the surface of the film, a continuous magnetic field which is unfavorable to the bubbles. The observation of the film in polarized transmitted light makes it possible to accurately determine the value of the collapse field when the bubbles suddenly disappear.

f) Calculation of the exchange constant A

The exchange constant is linked with the Curie temperature Tc by the relation:

$$A = 4.15 \cdot 10^{-14}(Tc-24)/267$$

(A in J·cm$^{-1}$, Tc in °C).

g) Measurement of the Curie temperature Tc

Tc corresponds to the passage from the ferrimagnetic to the paramagnetic state. Tc varies linearly with the magnetization or with the supersaturation temperature $\Delta T = Ts - Te$, in which Ts is the saturation temperature and Te the epitaxy temperature of the ferrimagnetic film.

An original method for measuring the Curie temperature has been developed by the Inventors. When the material passes from the ferrimagnetic to the paramagnetic state, the Faraday contrast disappears with the domains.

The heating cell used for this measurement has a temperature rise ensured by an alternating current in a coil. At the same time, said current causes in the coil a pulsed magnetic field, which vibrates the walls of the domains and the direction of this field is normal to the plane of the film. By raising the temperature (the pulsed field being well above the coercive field), the disappearance of the light signal signifies the passage to the paramagnetic state. The measurement of the Curie temperature by this method is accurate to within ±2° C.

TABLE I

| SAMPLE | COMPOSITION | h(μm) | $4\pi Ms$ ($\times 10^{-4}$T) | A(Jcm$^{-1}$) | Λo (μm) | h/Λo | MARGIN |
|---|---|---|---|---|---|---|---|
| 1 | $Y_{2.45}Sm_{0.15}Bi_{0.4}Fe_{3.7}Ga_{1.3}O_{12}$ | 2.24 | 118 | $1.71 \cdot 10^{-14}$ | 0.175 | 12.8 | YES |
| 2 | $Y_{2.45}Sm_{0.15}Bi_{0.4}Fe_{3.7}Ga_{1.3}O_{12}$ | 1.93 | 107 | $1.71 \cdot 10^{-14}$ | * | 10.1 | YES |
| 3 | $Y_{2.45}Sm_{0.15}Bi_{0.4}Fe_{3.7}Ga_{1.3}O_{12}$ | 1.94 | 123 | $1.71 \cdot 10^{-14}$ | 0.169 | 11.5 | YES |
| 4 | $Y_{2.45}Sm_{0.15}Bi_{0.4}Fe_{3.7}Ga_{1.3}O_{12}$ | 2.10 | 127 | $1.71 \cdot 10^{-14}$ | * | 12.9 | YES |
| 5 | $Y_{2.45}Sm_{0.15}Bi_{0.4}Fe_{3.7}Ga_{1.3}O_{12}$ | 2.21 | 123 | $1.71 \cdot 10^{-14}$ | 0.169 | 13.1 | YES |
| 6 | $Y_{2.45}Sm_{0.15}Bi_{0.4}Fe_{3.7}Ga_{1.3}O_{12}$ | 1.94 | 116 | $1.71 \cdot 10^{-14}$ | * | 12.0 | YES |
| 7 | $Y_{2.45}Sm_{0.15}Bi_{0.4}Fe_{3.7}Ga_{1.3}O_{12}$ | 2.69 | 138 | $1.71 \cdot 10^{-14}$ | * | 17.0 | NO |
| 8 | $Y_{2.45}Sm_{0.15}Bi_{0.4}Fe_{3.7}Ga_{1.3}O_{12}$ | 2.47 | 121 | $1.71 \cdot 10^{-14}$ | * | 14.4 | NO |
| 9 | $Y_{2.45}Sm_{0.15}Bi_{0.4}Fe_{3.7}Ga_{1.3}O_{12}$ | 2.82 | 125 | $1.71 \cdot 10^{-14}$ | * | 17.2 | NO |
| 10 | $Y_{2.45}Sm_{0.15}Bi_{0.4}Fe_{3.7}Ga_{1.3}O_{12}$ | 2.0 | 114 | $1.71 \cdot 10^{-14}$ | * | 11.1 | YES |
| 11 | $Y_{2.45}Sm_{0.15}Bi_{0.4}Fe_{3.7}Ga_{1.3}O_{12}$ | 2.99 | 127 | $1.71 \cdot 10^{-14}$ | * | 18.0 | NO |
| 12 | $Y_{2.45}Sm_{0.15}Bi_{0.4}Fe_{3.7}Ga_{1.3}O_{12}$ | 2.0 | 112 | $1.71 \cdot 10^{-14}$ | * | 10.9 | YES |
| 13 | $Y_{2.45}Sm_{0.15}Bi_{0.4}Fe_{3.7}Ga_{1.3}O_{12}$ | 2.03 | 145 | $1.71 \cdot 10^{-14}$ | * | 14.1 | NO |
| 14 | $(YSmBi)_3(FeGa)_5O_{12}$ | 2.16 | 147 | $1.71 \cdot 10^{-14}$ | * | 15.2 | NO |
| 15 | $(YSmBi)_3(FeGa)_5O_{12}$ | 2.38 | 140 | $1.71 \cdot 10^{-14}$ | * | 23.1 | NO |
| 15 | $(YSmBi)_3(FeGa)_5O_{12}$ | 2.79 | 133 | $1.71 \cdot 10^{-14}$ | * | 17.2 | NO |
| 17 | $(YSmBi)_3(FeGa)_5O_{12}$ | 3.10 | 147 | $1.71 \cdot 10^{-14}$ | * | 16.0 | NO |
| 18 | $Y_{1.58}Sm_{0.1}Yb_{0.09}Ca_{0.96}Bi_{0.34}Fe_{4.065}Ge_{0.616}Si_{0.23}O_{12}$ | 2.10 | 200 | $3.05 \cdot 10^{-14}$ | 0.135 | 15.6 | NO |
| 19 | $Y_{1.58}Sm_{0.1}Yb_{0.09}Ca_{0.96}Bi_{0.34}Fe_{4.065}Ge_{0.616}Si_{0.23}O_{12}$ | 2.07 | 212 | $3.05 \cdot 10^{-14}$ | 0.131 | 15.8 | NO |
| 20 | $(GdSmLuBiGa)_3(FeSi)_5O_{12}$ | 2.39 | 325 | $2.88 \cdot 10^{-14}$ | 0.080 | 29.0 | NO |
| 21 | $(SmLuBi)_3(FeGa)_5O_{12}$ | 3.85 | 185 | $1.80 \cdot 10^{-14}$ | 0.115 | 33.5 | NO |
| 22 | $(GdPrBi)_3(FeAl)_5O_{12}$ | 2.10 | 128 | $2.90 \cdot 10^{-14}$ | 0.21 | 9.95 | YES |
| 23 | $(GdPrBi)_3(FeAl)_5O_{12}$ | 2.05 | 144 | $2.90 \cdot 10^{-14}$ | 0.19 | 10.93 | YES |

*NOT CALCULATED VALUES.

TABLE II

| COMPOSITION | $n_{0.51}$ calculated | $n_{0.63}$ measured | $n_{0.68}$ calculated | $n_{1.15}$ measured | Factor N/h |
|---|---|---|---|---|---|
| $(YSmLuCa)_3(FeGe)_5O_{12}$ | 2.32 | 2.235 | 2.2 | 2.155 | 2.57 |
| $(Y)_3(FeGa)_5O_{12}$ | 2.42 | 2.305 | 2.28 | 2.207 | 2.7 |
| $(EuLuCa)_3(FeGe)_5O_{12}$ | 2.32 | 2.246 | 2.22 | 2.164 | 2.70 |
| $(YSmLuBi)_3(FeGa)_5O_{12}$ | 2.43 | 2.331 | 2.31 | 2.234 | 2.75 |

We claim:

1. Bloch line memory comprising a magnetic film of thickness h deposited on a non-magnetic substrate and containing Bloch lines of width $\Lambda o$ disposed across the magnetic film perpendicular to the substrate, wherein the magnetic film satisfies the condition (1) $h/\Lambda o < 14$ with $\Lambda o = A/2\pi Ms$, in which A represents a magnetic exchange constant and $4\pi Ms$ represents a saturation magnetization of the film.

2. Memory according to claim 1, wherein the magnetic film is a ferrimagnetic garnet.

3. Memory according to claim 2, wherein the film has the following composition:

$$(TR_3)(FeX)_5O_{12}$$

in which TR represents at least one element chosen from among Y, Sm, Lu, Bi, Ca, Gd, Pr and Yb and X represents at least one element chosen from among Al, Ga, Si and Ge.

4. Memory according to claim 1, wherein the film has the following composition:

$$(TR_3)(FeX)_5O_{12}$$

in which TR represents at least one element chosen from among Y, Sm, Lu, Bi, Ca, Gd, Pr and Yb and X represents at least one element chosen from among Al, Ga, Si and Ge.

5. Memory according to claim 1, also comprising at least one strip domain of width l located in the magnetic film, a cutting device for said domain comprising two electricity conducting strips parallel to one another and having a width of no more than W, the conducting strips being supported by the magnetic film and oriented perpendicular to the domain, the conducting strips being spaced from one another by a distance G and separated from the magnetic film by a distance D, the cutting device further comprising supply means for applying a first current pulse simultaneously to the two conducting strips, wherein the parameters l, W, G and D satisfy the following relations: $1 \leq l/D \leq 6$; $l/G \geq 1.1$; and $l/W \geq 1.3$.

6. Memory according to claim 5, wherein the supply means supply a first current pulse having a rise time Tm in excess of a rise time To which would be possessed by a second minimum current pulse necessary for the nucleation of the Bloch lines.

* * * * *